United States Patent [19]

Williams

[11] Patent Number: 4,626,771
[45] Date of Patent: Dec. 2, 1986

[54] ECL SLAVE REFERENCE GENERATOR

[75] Inventor: Bertrand J. Williams, San Jose, Calif.

[73] Assignee: Advanced Micro Devices, Inc., Sunnyvale, Calif.

[21] Appl. No.: 777,888

[22] Filed: Sep. 19, 1985

[51] Int. Cl.[4] .............................................. G05F 1/44
[52] U.S. Cl. .................................... 323/349; 323/274; 323/268; 307/296 R
[58] Field of Search ............... 323/313, 315, 316, 349, 323/350, 901, 267, 274, 268; 330/257; 307/24, 31, 69, 71, 77, 82, 296 R, 297, 358, 359

[56] References Cited
FOREIGN PATENT DOCUMENTS
1215 1/1983 Japan .................................... 323/267

Primary Examiner—Peter S. Wong
Assistant Examiner—Judson H. Jones
Attorney, Agent, or Firm—Patrick T. King; Davis Chin; J. Vincent Tortolano

[57] ABSTRACT

A plurality of locally-distributed ECL slave reference generators positioned throughout a large monolithic integrated circuit device for tracking closely a central master reference generator to provide stable slave reference voltages wherein each of the slave reference generators includes a differential comparator which has first and second inputs coupled to a master reference voltage and a slave reference voltage respectively for comparing the master reference voltage and the slave reference voltage and for generating a difference voltage output. A constant current source is coupled to the differential comparator for establishing a constant current flow through the differential comparator. A negative feedback device is responsive to the difference voltage output for supplying a feedback to the second input of the differential comparator as that the slave reference voltage tracks closely the master reference voltage.

20 Claims, 4 Drawing Figures

ECL SLAVE REFERENCE GENERATOR

DESCRIPTION

Background of the Invention

This invention relates generally to reference generator circuits and more particularly, it relates to an ECL slave reference generator which tracks closely a master reference generator for use on a large scale semiconductor integrated circuit device.

With the advent of large scale integration (LSI) technology, more and more circuit components are being fabricated on a single chip of a monolithic integrated circuits so as to yield a higher integration density. Such increased circuit density results in the advantage of reduced assembly cost, higher speed of operation, and lower power dissipation. These advantages have motivated logic circuit designers to desire increased numbers of logic gates to be formed by this LSI technology. When the logic gates consist of ECL circuits, there is required the need of a reference supply voltage from a reference generator to be connected to each of the current sources of the ECL circuits.

In a prior art layout of FIG. 1, the reference generator 10 is typically formed centrally on a monolithic integrated circuit 11 with a plurality of reference supply lines 12 being connected to the reference generator. A plurality of ECL circuits are formed directly in the monolithic integrated circuit 11 and are connected to various points along the supply lines 12. This suffers from the disadvantages of a large loading condition due to the high number of ECL circuits connected thereto and voltage drop problems due to the resistance in the metallic wiring connections. Therefore, the reference voltage as distributed from the central reference generator 10 will fluctuate and its value will be dependent upon the distant the reference voltage must be transmitted to the various ECL circuits, thereby causing an unstable operation. While there has been attempted heretofore of providing a plurality of unlinked reference generators on a monolithic integrated circuit as as to avoid the problems of loading and voltage drops, it has been found that the use of multiple reference generators do not guarantee tracking of the various reference voltages because of temperature differences throughout the integrated circuit.

It would therefore be desirable to provide a plurality of locally-distributed slave reference generators, which track closely a central master reference generator, when they are positioned throughout the monolithic integrated circuit, but avoids the problems of loading and voltage drops.

SUMMARY OF THE INVENTION

Accordingly, it is a general object of the present invention to provide an ECL slave reference generator for use on a large scale semiconductor integrated circuit device which is relatively simple and economical to manufacture and assemble, but yet overcomes the disadvantages of the prior art reference generator circuits.

It is an object of the present invention to provide a plurality of locally-distributed ECL slave reference generators, which track closely a central master reference generator, when they are positioned throughout a monolithic integrated circuit.

It is another object of the present invention to provide a locally-distributed ECL slave reference generator which tracks closely a master reference generator to produce a stable slave reference voltage that is unaffected by loading and voltage drops.

It is still another object of the present invention to provide an ECL slave reference generator which includes a differential comparator for comparing a master reference voltage and a slave reference voltage and for generating a difference voltage output, a current source coupled to the differential comparator for establishing a constant current through the comparator, and a negative feedback portion responsive to the difference voltage output for supplying a feedback current to the comparator so that the slave reference voltage tracks closely to the master reference voltage.

It is yet still another object of the present invention to provide a locally-distributed ECL slave reference generator which tracks closely a master reference generator for use on a large monolithic integrated circuit device which includes a differential comparator formed of first and second transistors, a current mirror arrangement formed of third and fourth transistors, and a negative feedback portion consisting of an emitter follower transistor.

In accordance with these aims and objectives, the present invention is concerned with the provision of a locally-distributed ECL slave reference generator which tracks closely a master reference generator for use on a large monolithic integrated circuit device. The slave reference generator includes a differential comparator, a current mirror arrangement, and a negative feedback portion. The differential comparator is formed of first and second transistors whose emitters are coupled together at a first mode. The collector of the first transistor is connected to a supply potential via a first resistor. The collector of the second transistor is coupled to a second node and to the supply potential via a second resistor. The base of the first transistor is connected to an input master reference voltage. The base of the second transistor is connected to a third node to produce a stable sleeve reference voltage. The current mirror arrangement is formed of third and fourth transistors whose emitters are coupled together and to a voltage source. The base and collector of the third transistor are connected together and to a fourth node, one end of a third resistor, and the base of the fourth transistor. The other end of the third resistor is connected to the third node. The collector of the fourth transistor is connected to the common emitters of the first and second transistors. The negative feedback portion is formed of a fifth transistor having its collector connected to the supply potential, its base connected to the second node and its emitter connected to the third node.

BRIEF DESCRIPTION OF THE DRAWINGS

For a more complete understanding of the present invention and for further objects and advantages thereof, reference is now made to the following detailed description taken in conjunction with the drawings, wherein.

DESCRIPTION OF THE PREFERRED EMBODIMENTS

Figure 1:
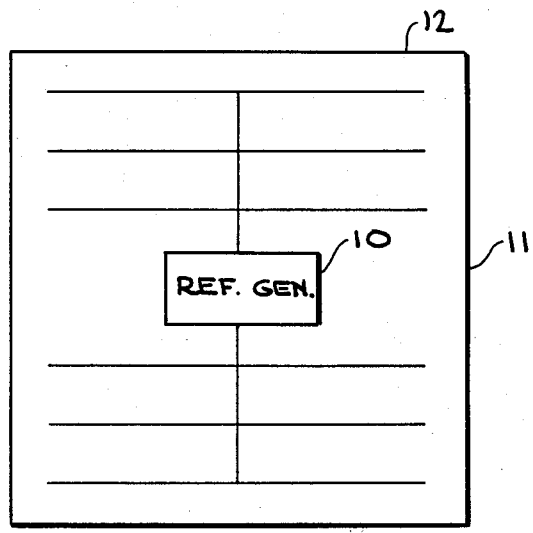
FIG. 1 is a layout of a typical central reference generator of the prior art for distributing a reference voltage throughout a monolithic die.

Referring now in detail to the drawings, FIG. 1 is a layout of a typical central reference generator 10 of the prior art for distributing a reference voltage throughout a monolithic die or chip 11. A plurality of reference supply line 12 are connected to the reference generator 10 for distributing the reference voltage. For example, a number of ECL circuits (not shown) each having a constant current source that requires a reference voltage may be connected to various points along the reference supply line 12. However, this causes large loading as the number of ECL circuits are increased since they are all driven by the same reference generator 10. Further, the layout of FIG. 1 also encounters the defect that the voltage drops increase due to the routing of the reference supply lines 12 over a relatively large distance on the monolithic die 11.

Figure 2:
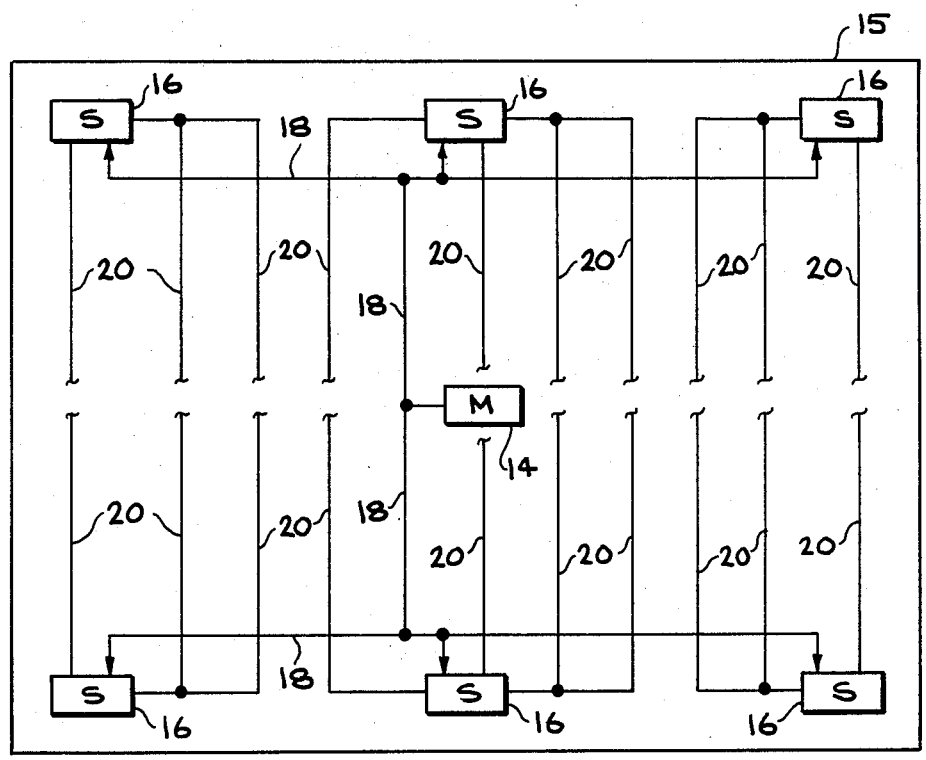
FIG. 2 is a layout showing a master reference generator and a plurality of slave reference generators of the present invention for distributing reference voltages throughout a monolithic die.

In order to overcome the problems of loading and voltage drops, the present invention is concerned with the provision of a plurality of slave reference generators which track closely a master reference generator and are locally-distributed throughout a large monolithic die so as to reduce loading and voltage drops. FIG. 2 is a layout envisioned by the present invention in which a single central master reference generator 14 and a plurality of locally-distributed ECL slave reference generators 16 are used for distributing reference voltages throughout a large monolithic die 15. As can be seen, each of the slave reference generators 16 are connected to the master reference generator 14 by master reference reference lines 18. Each of the slave reference generators 16 are connected to slave reference lines 20 for distributing the reference voltages throughout the monolithic die 15. Again, ECL circuits (not shown) may be connected to various points along the slave reference lines 20. Since the length of these slave reference lines are made to run only a relatively short distance across the monolithic die, the problem of voltage drops can be significantly reduced. With the use of a plurality of slave reference generators 16, loading problems on the master reference generator 14 has been eliminated since the slave reference generators are used to drive the loads (ECL circuits). Thus, each slave reference generator 16 is used to drive a smaller number of loads. The slave reference voltage from each of the slave reference generators will better track the master reference generator due to the fact that the master reference voltage from the master generator will now be independent of the loading.

Figure 3:
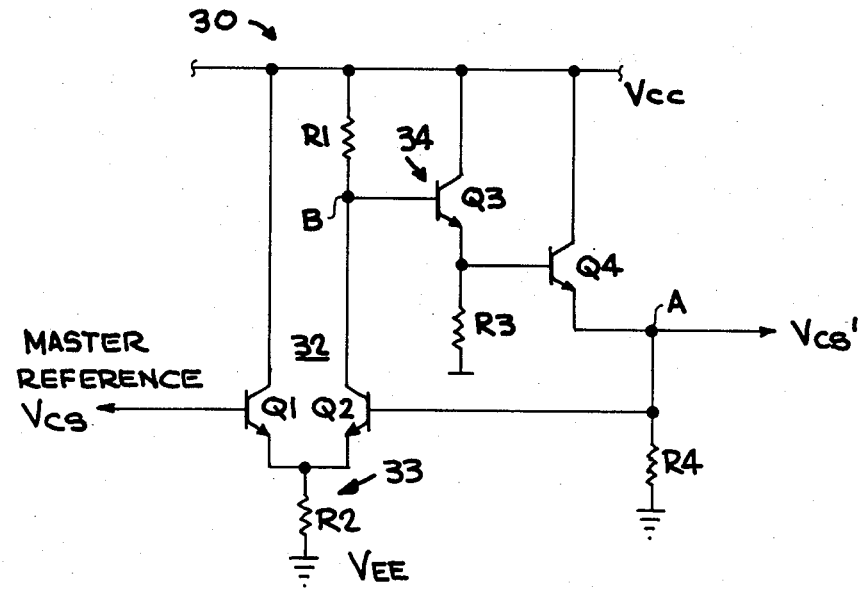
FIG. 3 is a schematic circuit diagram of an ECL slave reference generator of the present invention.

FIG. 3 is a schematic circuit diagram of a circuit arrangement for implementing an ECL slave reference generator for distributing an ECL reference voltage $V_{CS}$ throughout a monolithic integrated circuit. The slave reference generator 30 includes a differential comparator portion 32, a current bias portion 33, and a negative feedback portion 34. The differential comparator portion 32 consist of a first transistor Q1 and a second transistor Q2 whose emitters are coupled together. The collector of the transistor Q1 is tied to a supply potential VCC, and the collector of the transistor Q2 is also tied to the supply potential VCC via a collector load resistor R1. The common emitters of the transistors Q1 and Q2 are connected to one end of a resistor R2 defining the current bias portion 33. The other end of the resistor R2 is connected to a voltage source VEE. Typically, the supply potential VCC is approximately +5 volts and the voltage source is at a ground potential. The base of the transistor Q1 is connected to an input signal or master reference voltage $V_{CS}$ from the master reference generator 14 (FIG. 1). The base of the transistor Q2 is connected to an output voltage from the negative feedback portion 34 which is defined as the slave reference voltage $V_{CS'}$. It should be understood that the current bias portion 33 consisting of the resistor R2 may be replaced by a constant current source.

The negative feedback portion 34 includes a Darlington configuration formed by transistors Q3 and Q4, a resistor R3 and a bias resistor R4. The collectors of the transistors Q3 and Q4 connected together and to the supply potential VCC. The base of the transistor Q3 is connected to the junction of the resistor R1 and the collector of the transistor Q2. The base of the transistor Q4 is connected to the emitter of the transistor Q3 and to one end of the resistor R3. The other end of the resistor R3 is connected to the voltage source VEE or ground potential. The emitter of the transistor Q4 is connected to an output node A, one end of the bias resistor R4, and the base of the transistor Q2. The output node A provides the slave reference voltage $V_{CS'}$ which is adapted for connection to the various ECL circuits.

In operation, assuming an increase in the master reference voltage $V_{CS}$. This causes the transistor Q1 to conduct more current and the transistor Q2 to conduct less current. Thus, there will be more collector current flowing through the collector of the transistor Q1 than through the resistor R1 and the collector of the transistor Q2. As a result, the voltage at node B defining the output of the differential comparator will rise so as to cause the output voltage or the slave reference voltage $V_{CS'}$ to increase. Since the voltage $V_{CS'}$ is fed back to the base of the transistor Q2, this in turns causes the transistor Q2 to conduct more, thereby reducing the voltage at the node B. This process continues until the slave reference voltage $V_{CS'}$ is equalized or stabilized to the master reference voltage $V_{CS}$. Similarly, if there is a decrease in the master reference voltage $V_{CS}$ this causes the transistor Q1 to conduct less and the transistor Q2 to conduct more. Thus, there will be more current flowing through the resistor R1 and the collector of the transistor Q1. As a result, the voltage at the node B will drop so as to cause the output voltage which is the slave reference voltage $V_{CS'}$ to decrease. Again, since this output voltage is fed back to the base of the transistor Q2 this causes the transistor Q2 to conduct less, thereby increasing the voltage at the node B. Again, this process continues until the slave reference voltage $V_{CS'}$ is stabilized to the master reference voltage $V_{CS}$.

Accordingly, the master reference voltage $V_{CS}$ at the base of the transistor Q1 is compared constantly to the slave reference voltage $V_{CS'}$ at the base of the transistor Q2. A portion of the current flowing through the resistor R1 is fed back through transistor Q3 and Q4 functioning as an emitter follower to stabilize the slave reference voltage $V_{CS'}$ so that it tracks closely the master reference voltage $V_{CS}$. It should be understood that the Darlington configuration could be replaced with a single transistor when the required driving current is relatively small such as under low load conditions.

Figure 4:
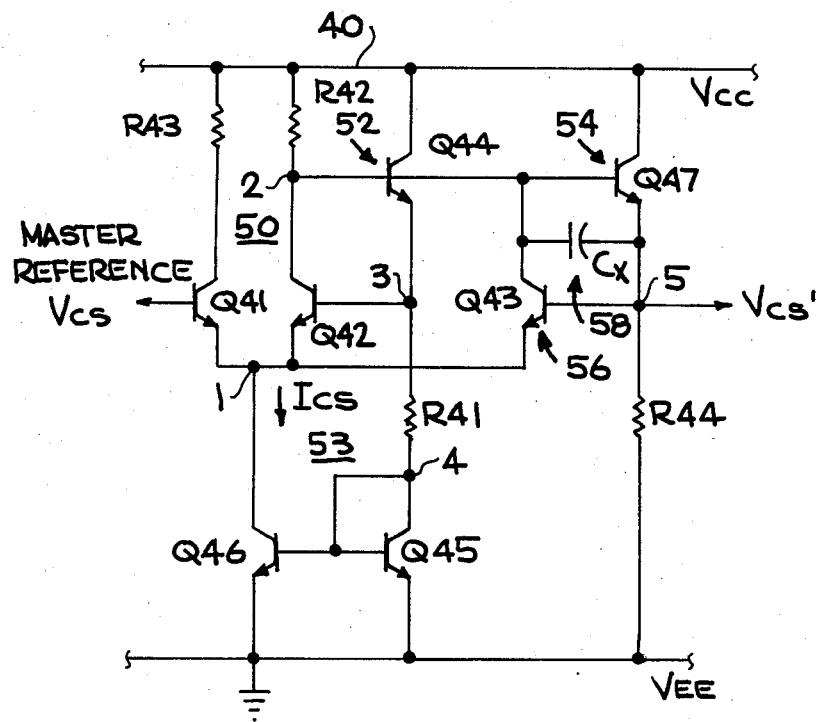
FIG. 4 is a schematic circuit diagram of a second embodiment of an ECL slave reference generator of the present invention.

FIG. 4 is a schematic circuit diagram of a second embodiment of an ECL slave reference generator 40 provides an improved tracking of the slave reference voltage $V_{CS'}$ to the master reference voltage from the master reference generator over a wide range of load conditions as well as under transient "glitch" conditions. The slave reference generator 40 is comprised of a differential comparator portion 50, a negative feedback portion 52, a high-gain current mirror portion 53, an output driver portion 54, a power-up protection portion 56, and a high-frequency compensation portion 58.

The differential comparator portion 50 includes a first transistor Q41 and a second transistor Q42 whose emitters are coupled together at node 1. The collector of the transistor Q41 is connected to a supply potential VCC via a collector load transistor R43, and the collector of the transistor Q42 is connected to node 2 and also to the supply potential VCC via a collector load resistor R42. The supply voltage VCC is typically at +5 volts. The base of the transistor Q41 is connected to an input signal consisting of a master reference voltage $V_{CS}$ from the master reference generator 14 (FIG. 1). The base of the transistor Q42 is connected to node 3 which defines a tracking voltage T which is unaffected by loading of the slave reference voltage $V_{CS'}$ at node 5.

The negative feedback portion 52 includes an emitter follower transistor Q44 having its base connected to the node 2, its collector connected to the supply potential VCC and its emitter connected to the node 3. The current mirror portion 53 is formed of transistors Q45 and Q46. The emitters of the transistors Q45 and Q46 are connected together and to a voltage source VEE which is typically at a ground potential. The base and collector of the transistor Q45 are connected together at node 4 and to the base of the transistor Q46. The collector of the transistor Q45 is connected to the node 3 via a resistor R41. The collector of the transistor Q46 is connected to the common emitters of the transistor Q41 and Q42. The high-gain is achieved by the current mirror arrangement 43 functioning as a current source for supplying a bias current $I_{CS}$ through the differential comparator 50. The current mirror gain G is determined by the following approximate ratio:

$$G \approx (R42/R41)(A_{Q46}/A_{Q45})$$

Where
R41 = value of resistor R41 in ohms
R42 = value of resistor R42 in ohms
$A_{Q45}$ = area of emitter of transistor Q45 in square microns
$A_{Q46}$ = area of emitter of transistor Q46 in square microns The output driver portion 54 includes a second emitter follower transistor Q47 and a DC bias resistor R44. The base of the transistor Q47 is connected to the node 2, and the collector of the transistor Q47 is connected to the supply potential VCC. The emitter of the transistor Q47 is connected to an output node 5 which defines the slave reference voltage $V_{CS'}$ and to one end of the resistor R44. The other end of the resistor R44 is tied to the voltage source VEE. The power-up protection portion 56 comprises a transistor Q43 having its base connected to the outpt node 5, its collector connected to the node 2, and its emitter connected to the common emitters of the transistors Q41 and Q42. The high-frequency compensation portion 58 consist of a capacitor $C_X$ having its one end connected to the node 2 and its other end connected to the output node 5. The capacitor $C_X$ provides high-frequency compensation so as to prevent possible oscillations and/or ringing from occuring under various load conditions and due to transient "glitches".

The operation of the slave reference generator 40 will now be described. The differential comparator 50 is used to compare the tracking voltage $V_T$ on the base of the transistor Q42 at the node 3 with the master reference voltage $V_{CS}$ at the base of the transistor Q41. The emitter follower transistor Q44 samples the voltage at the collector of the transistor Q42 to provide negative feedback to the base of the transistor Q42 so as to cause the voltage at the node 3 to track closely the voltage at the node 3 to track closely the voltage at the base of the transistor Q41. In addition, part of the emitter current from the emitter follower transistor Q44 will flow through the resistor R41 and into the bases of the transistor Q45 and Q46 of the current mirror arrangement. As a result, the base current of the transistor Q46 is amplified to supply a much larger bias current balance via the current $I_{CS}$ through voltage at the node 3 with the input voltage.

The second emitter follower transistor Q47 receives at its base a portion of the current flowing in the collector resistor R42 so as to provide an increased driving current at the output node 5 for driving a relatively large number of loads connectable thereto. Normally, the transistor Q43 is not conductive and is rendered conductive only when the slave reference voltage $V_{CS'}$ at the node 5 becomes higher than the master reference voltage $V_{CS}$. This occures when the master reference voltage has been inactivated and is then powered-up so that the tracking voltage $V_T$ has not had a chance to stabilize. Under this condition, the transistor Q43 prevents the transistor Q46 from delivering a large amount of current to the loads. The capacitor $C_X$ prevents the differential comparator from oscillating and provides stability for the overall circuitry.

It should be noted that if a higher driving current is required at the output node 5 the second emitter follower transistor Q47 may be replaced by a pair of transistors connected in a Darlington cofiguration. Also, in order to provide a tracking at the nodes 3 and 5 in this case, the emitter follower transistor Q44 will also be formed as a Darlington configuration. Further, it will be understood by those skilled in the art that the slave reference generator of FIGS. 3 and 4 are formed on a part of a single silicon chip of the integrated circuit containing the various ECL logic gate circuitry.

For completeness in the disclosure of the slave reference generator of FIG. 4, but not for purposes of limitation, the following representative values of the resistors and capacitors are submitted hereunder in Table I. The values were employed in a slave reference generator that was constructed and tested in which provides high quality performance. However, those skilled in the art will recognize that may alternatives elements and values may be employed in constructing circuitry in accordance with the present invention.

TABLE I

| Component | Value |
|---|---|
| R41 | 700 ohms |
| R42 | 3.5 kilohms |
| R43 | 3.5 kilohms |
| R44 | 3.0 kilohms |

TABLE I-continued

| Component | Value |
| --- | --- |
| $C_X$ | 0.5 pF |

The dimensions of the emitter of the transistors Q41 through Q47 in FIG. 4 are shown in Table II. Given these emitters areas and the above resistor values, the gain of the current mirror arrangement is approximate 15 as determined from the previously discussed ratio.

TABLE II

| Component | Emitter Area ($\mu^2$) |
| --- | --- |
| Q41 | 80 |
| Q42 | 40 |
| Q43 | 40 |
| Q44 | 40 |
| Q45 | 20 |
| Q46 | 60 |
| Q47 | 160 |

From the foregoing detailed description it can thus be seen that the present invention provides an ECL slave reference generator which tracks closely a master reference generator for use on a large monolithic integrated circuit device. The slave reference generator of the present invention includes a differential comparator, a current mirror arrangement, and a negative feedback portion.

While there has been illustrated and described what are at present to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention, but that the invention will include all embodiments falling within the scope of the appended claims.

What is claimed is:

1. A locally-distributed ECL slave reference generator which tracks closely a master reference generator for use on a large monolithic integrated circuit device, said slave reference generator comprising:

differential comparator means formed of first and second transistors whose emitters are coupled together at a first node, the collector of said first transistor being connected to a supply potential via a first resistor, the collector of said second transistor being connected to a second node and to the supply potential via a second resistor, the base of said first transistor being connected to an input master reference voltage, the base of said second transistor being connected to a third node to produce a stable slave reference tracking voltage;

current mirror means formed of third and fourth transistors whose emitters are coupled together and to a voltage source, the base and collector of said third transistor being connected together and to a fourth node, one end of a third resistor, and the base of said fourth transistor, the other end of said third resistor being connected to the third node, the collector of said fourth transistor being connected to the common emitters of said first and second transistors; and negative feedback means formed of a fifth transistor having its collector connected to the supply potential, its base connected to the second node and its emitter connected to the third node.

2. A locally-distributed ECL slave reference generator as claimed in claim 1, further comprising an output driver means formed of a sixth transistor and a fourth resistor, the collector of said sixth transistor being connected to the supply potential, the base of said sixth transistor being connected to the second node, the emitter of said sixth transistor being connected to a fifth node to produce a slave reference voltage and to one end of the fourth resistor, the other end of said fourth resistor being connected to the voltage source.

3. A locally-distributed ECL slave reference generator as claimed in claim 2, further comprising power-up protection means formed of a seventh transistor having its collector connected to the second node, its base connected to the fifth node, and its emitter connected to the first node.

4. A locally-distributed ECL slave reference generator as claimed in claim 3, further comprising high-frequency compensation means being formed of a capacitor having its one end connected to the second node and its other end connected to the fifth node.

5. A locally-distributed ECL slave reference generator as claimed in claim 1, wherein said first through fourth transistors are of the NPN-type conductivity.

6. A locally-distributed ECL slave reference generator as claimed in claim 1, wherein said slave reference generator is formed on a single silicon chip of an integrated circuit.

7. A locally-distributed ECL slave reference generator as claimed in claim 1, wherein the gain of said current mirror means is determined by the ratio of the product of the resistance values of the second resistor and the emitter area of said fourth transistor divided by the product of the resistance value of the third resistor and the emitter area of said third transistor.

8. A locally-distributed ECL slave reference generator as claimed in claim 1, further comprising a output driver means formed of a pair of transistors connected in a Darlington configuration.

9. A locally-distributed ECL slave reference generator as claimed in claim 8, wherein said fifth transistor is replaced by a Darlington configuration.

10. A plurality of locally-distributed ECL slave reference generators positioned throughout a large monolithic integrated circuit device for tracking closely a central master reference generator to provide stable slave reference voltages, each of said slave reference generators comprising:

differential comparator means formed of first and second transistors whose emitters are coupled together at a first node, the collector of said first transistor being connected to a supply potential via a first resistor, the collector of said second transistor being connected to a second node and to the supply potential via a second transistor, the base of said first transistor being connected to an input master reference voltage, the base of said second transistor being connected to a third node to produce a stable slave reference tracking voltage;

current mirror means formed of third and fourth transistors whose emitters are coupled together and to a voltage source, the base and collector of said third transistor being connected together and to a fourth node, one end of a third resistor, and the base of said fourth transistor, the other end of said third transistor being connected to the third node, the collector of said fourth transistor being connected to the common emitters of said first and second transistors; and a negative feedback means formed of a fifth transistor having its collector connected to the supply potential, its base connected to the second node and its emitter connected to the third node.

11. A plurality of locally-distributed ECL slave reference generators as claimed in claim 10, further comprising an output driver means formed of a sixth transistor and a fourth resistor, the collector of said sixth transistor being connected to the supply potential, the base of said sixth transistor being connected to the second node, the emitter of said sixth transistor being connected to a fifth node to produce a slave reference voltage and to one end of the fourth resistor, the other end of the fourth resistor being connected to the voltage source.

12. A plurality of locally-distributed ECL slave reference generators as claimed in claim 11, further comprising power-up protection means formed of a seventh transistor having its collector connected to the second node, its base connected to the fifth node, and its emitter connected to the first node.

13. A plurality of locally-distributed ECL slave reference generators as claimed in claim 12, further comprising high-frequency compensation means formed of a capacitor having its one end connected to the second node and its other end connected to the fifth node.

14. A plurality of locally-distributed ECL slave reference generators as claimed in claim 10, wherein said first through fourth transistors are of the NPN-type conductivity.

15. A plurality of locally-distributed ECL slave reference generators as claimed in claim 10, wherein said plurality of locally-distributed ECL slave reference generators are formed as part of the large monolithic integrated circuit device.

16. A plurality of locally-distributed ECL slave reference generators positioned throughout a large monolithic integrated circuit device for tracking closely a central master reference generator to provide stable slave reference voltage, each of said slave reference generator comprising:

differential comparator means having first and second inputs coupled to a master reference voltage and a slave reference voltage respectively for comparing said master reference voltage and said slave reference voltage and for generating a difference voltage output;

current source means coupled to said differential comparator means for establishing a constant current flowing through said differential comparator means; and negative feedback means responsive to said differential voltage output for supplying a feedback current to said second input of said differential comparator means so that said slave reference voltage tracks closely said master reference voltage.

17. A plurality of locally-distributed ECL slave reference generators as claimed in claim 16, wherein said differential comparator means is formed of first and second transistors.

18. A plurality of locally-distributed ECL slave reference generators as claimed in claim 17, wherein said current source means is formed of an emitter resistor.

19. A plurality of locally-distributed ECL slave reference generators as claimed in claim 18, wherein said negative feedback comprises an emitter follower transistor.

20. A plurality of locally-distributed ECL slave reference generators as claimed in claim 19, wherein all of said transistors are of the NPN-type conductivity.

* * * * *